Aug. 13, 1963 W. F. GRIFFITH 3,100,878

BOOT STRAP ELECTRONIC AMPLIFIER HAVING IN-PHASE GRIDS

Filed Dec. 9, 1959 2 Sheets-Sheet 1

INVENTOR
WILLIAM F. GRIFFITH

BY

ATTORNEY

INVENTOR
WILLIAM F. GRIFFITH
BY Jacobi & Davidson
ATTORNEY

United States Patent Office 3,100,878
Patented Aug. 13, 1963

3,100,878

BOOT STRAP ELECTRONIC AMPLIFIER HAVING IN-PHASE GRIDS

William F. Griffith, 120 W. Seminary Ave., Lutherville, Md.

Filed Dec. 9, 1959, Ser. No. 858,384
10 Claims. (Cl. 330—81)

This invention relates to improved electronic amplifier circuits. More particularly, this invention relates to amplifier circuits which are capable of operating over a wide band of frequencies and which are capable of serving as power amplifiers.

Various types of broad band amplifiers have heretofore been disclosed in prior patents and publications. Such amplifiers, however, have a large number of components, which makes their fabrication unduly expensive. Moreover, the prior art amplifiers require double channels in instances where fail-safe operation is desired.

Some types of prior art amplifiers have utilized negative feedback in order to achieve improved characteristics, however, such amplifiers necessitate the incorportion of specific components for feedback coupling, such as, for example, voltage dividers. For cathode follower power amplifiers using supply voltages in excess of 100 volts D.C., commercially available tubes require utilization of special means for electrically insulating the heater from the cathode.

A primary object of the present invention is to provide an improved amplifier which is capable of operating over a broad band of frequencies, but which utilizes fewer components than heretofore developed broad band feedback amplifiers.

Still another object of this invention is to provide an amplifier of the above-described type which provides for fail-safe operation without the incorporation of an additional channel. It is to be understood that the term "fail-safe" as used in this specification relates to systems in which signals are transmitted between an input point and an output point even if certain parts of the system do not function normally. The signals transmitted through the system in fail-safe operation of the present invention are sufficient to convey the desired information, but are not necessarily transmitted to the output at maximum power.

A still further object of this invention is to provide an amplifying system in accordance with the above-described objects which achieves the benefits or improved characteristics associated with negative feedback type circuits, but which does not require the incorporation of specific parts for negative feedback.

Yet another and more specific object of this invention is to provide an amplifier system of the above-described type wherein a separate channel of information may be conveniently introduced into the last stage of the system whereby the system serves as a mixing circuit.

Still another object of this invention is to provide an amplifying system which is capable of utilizing a single container, or glass envelope, having a plurality of valves therein utilizing a common anode.

Briefly, and in its simplest aspects, the invention comprises the improvement in an amplifier circuit having at least two amplifying stages which comprises coupling the anode of the first stage with the anode of the second stage without having any substantial impedance in such connection, coupling the primary of a transformer having a 1:1 ratio in the cathode circuit of the second stage, and coupling an output transformer between the common anode coupling and the secondary of the transformer in the cathode circuit of the second stage.

The word "stage" as used herein refers to separate operating means which are connected for cooperative dependent operation, and it should be understood that such term does not refer to an amplifying stage in the sense such term is used in connection with, for example, conventional amplifiers having a series of amplifying means operating with independent plate current paths except for a possible common power connection.

The invention will be better understood, and objects other than those specifically set forth above will become apparent to one of ordinary skill in the art after considering the following detailed description of exemplary embodiments of the invention. The exemplary embodiments are shown schematically in the annexed drawings wherein.

Figure 1:
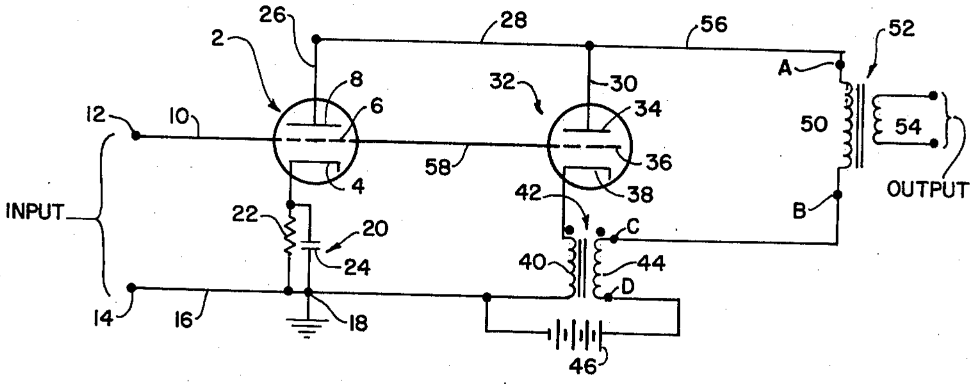
FIGURE 1 is a schematic diagram presenting the preferred embodiment of the invention, incorporating triode type electronic valves.

Referring now more particularly to the drawings, FIGURE 1 presents in basic form a schematic diagram of a system provided by this invention particularly designed for fail-safe operations. In FIGURE 1, the number 2 designates a thermionic valve having three electrodes; namely, a cathode 4, a grid 6 and an anode or plate 8. The grid 6 is coupled via lead 10 to input point 12. The other input point 14 is coupled via lead 16 to electrical ground as at point 18.

Cathode 4 is coupled via a standard bias network 20 to electrical ground. The bias network comprises a bias resistor 22 and a bypass capacitor 24, however, it should be understood that the particular form of bias network utilized in the system does not form a part of the present invention.

The thermionic valve 2 and above-described components associated therewith comprise a first stage of the amplifying system shown in FIGURE 1. This first stage has an anode connection 26 which is directly coupled via lead 28 to the anode connection 30 of a second stage. The second stage comprises a thermionic valve 32 having a plate or anode 34, a grid 36, and a cathode 38. The cathode 38 of the second stage is coupled to electrical ground via a primary winding 40 of a transformer 42.

Also coupled to electrical ground is the negative side of a direct voltage power supply 46. The power supply 46 as shown consists of a battery, however, it should be understood that any D.C. power source may be utilized without departing from the scope and spirit of the invention. The positive side of the power supply 46 is coupled to one end of a secondary winding 44 of transformer 42. The other end of secondary winding 44 is coupled to one end of the primary winding 50 of an output transformer 52. The other end of the primary winding of the output transformer 52 is coupled via lead 56 to the anode connections 26 and 30.

A signal to be amplified is fed into the system between points 12 and 14, and the amplified output is taken across a secondary winding 54 of output transformer 52.

In operation, the first stage of the system shown in FIGURE 1 serves as a voltage amplifier and the second stage of the system of FIGURE 1 serves as a power amplifier stage. It is apparent from the drawing that the grids 6 and 36 of the thermionic valves 2 and 32 are directly coupled via lead 58 and thus are continuously maintained at the same potentials with respect to electrical ground although their potentials with respect to their respective cathodes are different.

From the foregoing discussion it should be apparent that the system of FIGURE 1 provides an amplifying system wherein the anode connections of both stages are coupled together with substantially no electrical resistance therebetween, and wherein the anode connections are coupled to one end of the primary winding of the output transformer.

The transformer 42 serves as an impedance means coupling the cathode 38 with the other end of the primary winding of the output transformer, and serving to maintain the voltage between the cathode 38 and electrical ground substantially equal in phase and magnitude to the voltage between the other end B of the output transformer and electrical ground. The transformer 42 has an equal number of turns in the primary and secondary so as to maintain the above voltage relationship, and may be appropriately designated as a transformer having substantially a 1:1 ratio, or a bifilar transformer.

The primary winding 40 of transformer 42 has sufficient D.C. resistance to generate a bias for the cathode 38. It should be understood, however, that in the event grids 6 and 36 are operated with positive potentials, it is not necessary to generate such bias, or the bias created by virtue of the bias in network 20.

Although the circuit of FIGURE 1 has been presented schematically to show the invention, it will be understood by those of ordinary skill in the art that a grid leak resistor, input bypass capacitor, and like elements may be incorporated in the circuit without departing from the invention. Moreover, the triodes 2 and 32 may be replaced by pentodes as will be apparent from the discussion of FIGURE 3 hereinafter.

Figure 2:
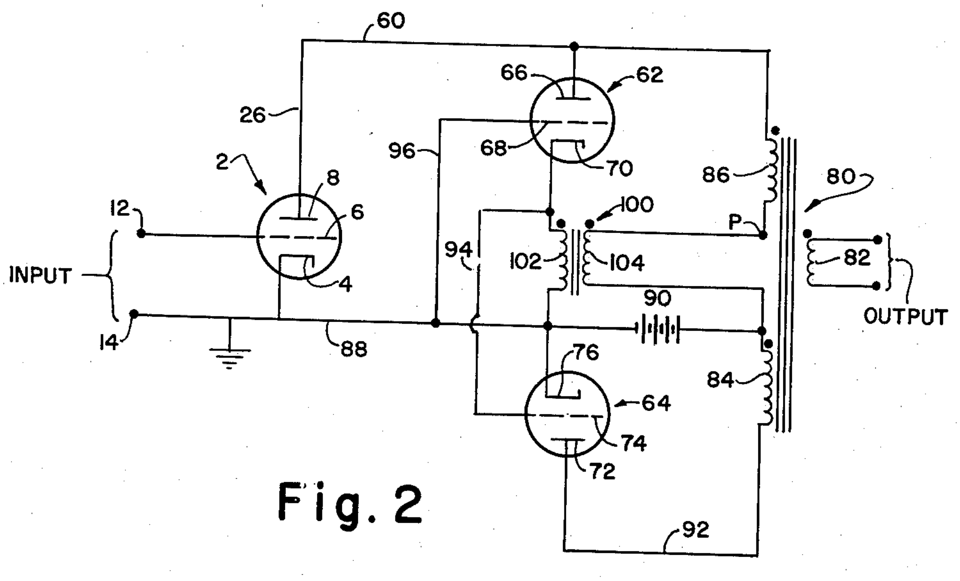
FIGURE 2 is a schematic diagram of the invention as utilized in a circuit having a push-pull output type coupling.

In FIGURE 2 of the drawings, the invention is applied to a system wherein push-pull operation is utilized. The first stage of the system of FIGURE 2 is essentially the same as the first stage of the system of FIGURE 1. A thermionic valve 2 having a plate 8, a grid 6, and a cathode 4, is utilized and the input is applied between points 12 and 14. The anode connection 26 is coupled via a lead 60 to the anode of valve 62 in the second stage of the system of FIGURE 2.

The second stage of the FIGURE 2 system incorporates in addition to valve 62 a valve 64. Valve 62 has a plate 66, a grid 68, and a cathode 70, and valve 64 has a plate 72, a grid 74, and a cathode 76. The plates 66 and 72 are coupled to the secondary 82 of output transformer 80 via output primary winds 86 and 84 respectively.

The cathode 76 of valve 64 is coupled to a ground bus 88. Also coupled to the ground bus 88 is the negative side of a D.C. power supply 90. The positive side of the power supply 90 is coupled to the plate 72 via winding 84 and lead 92.

The grid 74 of valve 64 is coupled with the cathode 70 of valve 62 by lead 94. The grid 68 of valve 62 is coupled to the ground bus 88 by lead 96. The primary winding 102 of a transformer 100 is coupled between the cathode 70 of valve 62 and the ground bus 88, and the secondary winding 104 of transformer 100 is coupled between the positive side of the power supply 90 and the primary winding 86 of output transformer 80.

The transformer 100 serves as an impedance mechanism coupling the cathode 70 with end P of the primary winding 86 of output transformer 80, and serves to maintain the voltage between cathode 70 and ground bus 88 substantially equal in magnitude and phase to the A.C. voltage between end P of primary winding 86 and electrical ground.

In the FIGURE 2 system the input is applied, as suggested above, between terminals 12 and 14, and the output is taken across secondary winding 82 of output transformer 80. Valves 62 and 64 are operated in push-pull relation so that each valve contributes to the output taken from the secondary winding 82 of the output transformer 80.

It should be understood that various biasing components such as, for example, that which would normally be used to bias cathode 4, have not been included in the schematic diagram of FIGURE 2.

Figure 3:
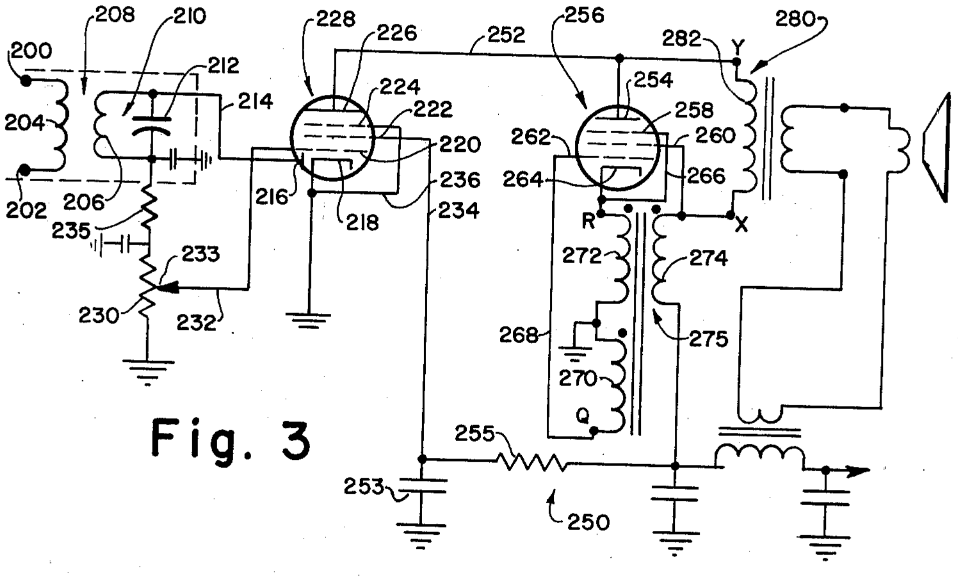
FIGURE 3 is a schematic diagram showing the invention as applied to an existing radio receiver.

In FIGURE 3 of the drawings, a system such as that shown in FIGURE 1 is incorporated into a radio receiver. The system is essentially the same as that shown in FIGURE 1, however, an additional winding is coupled in the second stage for preservation of greater sensitivity, and a remote cutoff pentode is utilized in the first stage and coupled into the circuit for automatic volume control (AVC). Referring specifically to the system of FIGURE 3, an amplitude-modulated carrier signal from a preceding stage of the radio receiver is applied across the primary winding 204 of a transformer 208. The secondary winding 206 of transformer 208 has coupled thereacross a capacitor 212 so that the winding 206 and capacitor 212 form a tuned circuit 210. One side of the capacitor or tuned circuit is coupled via a lead 214 to a plate 216 carried within an electronic valve 228. The plate 216 serves with the cathode 218 of the valve 228 as a detecting diode which generates audio signals between electrical ground and the tuned circuit 210. Thus a signal appears across potentiometer 230, and this signal is fed via lead 232 to grid 220 of the remote cutoff valve 228. The contact 233 of potentiometer 230 serves as a means to manually adjust the input audio signal level to the grid 220 of valve 228. The lead 232 not only feeds the audio signal to grid 220, but also serves to feed AVC bias voltage to the grid 220.

As is apparent from the drawing, the screen grid 222 of valve 228 is coupled via lead 234 to a power supply filter 250, and the suppressor grid 224 is coupled via lead 236 with the cathode 218. The valve 228 and associated components serve as a first stage of the amplifying system provided by this invention. It is important to note also the fact that such valve includes a detector (plate 216, cathode 218) which if desired can be a separate component.

The plate 226 of the first stage of the system is coupled via lead 252 with the plate 254 of the second stage of the system. The plate 254 is part of a pentode valve 256 which has a suppressor grid 258, a screen grid 260, a control grid 262, and a cathode 264. The suppressor grid 258 is coupled to the cathode 264 via lead 266, and the control grid 262 is coupled to electrical ground via lead 268 and winding 270 of a transformer which will be more specifically discussed hereinafter. The cathode 264 is coupled to electrical ground through the primary winding 272 of transformer 275. The secondary winding 274 of transformer 275 has one end coupled to the power supply filter 250 and the other end coupled to one end X of the primary winding 282 of the output transformer 280. The other end Y of the output transformer is coupled to the lead 252 which serves to connect the anodes of the first and second stages together.

The winding 270 referred to hereinabove is a tertiary winding of transformer 275 and serves to increase the sensitivity of the system. The windings 270 and 272 are so connected that the voltage appearing at point R, or on the cathode 264, is 180 degrees out of phase with the voltage appearing at point Q, or on grid 262. All of the above voltages are considered to be phased with respect to electrical ground.

From the foregoing discussion of the system of FIGURE 3, it is apparent that the anodes of the first and second stages are coupled together with substantially no electrical impedance therebetween, and that the anodes are coupled to one end of the primary winding of the output transformer. As is the case with the system of FIGURE 1, the transformer in the cathode circuit of the second stage, transformer 275, is an impedance means coupling the cathode 264 with the end X of; the primary winding of the output transformer, and serves to maintain the voltage between cathode 264 and electrical ground substantially equal in magnitude and phase to the voltage between end X of primary winding 282 and electrical ground. The number of turns in windings 270, 272 and 274 are substantially equal.

The system of FIGURE 3 in addition to incorporating the components of the system of FIGURE 1, provides means coupled with the first stage for producing automatic audio volume control, which means may be manually adjusted so as to operate the valve of the first stage whereby the output is substantially equal regardless of the strength of the signal applied at the output of the receiver. It is assumed for the purpose of explanation of the system of FIGURE 3 that previous stages are incorporated in the receiver, and that such stages are provided with automatic volume control.

By adjusting the slider 233 on the potentiometer 230 toward the top of potentiometer 230, the gain achieved in valve 228 is comparatively low when a strong signal is fed across transformer 204, and the gain of such valve is a maximum in the event a weak signal is fed in across transformer 204. By adjusting the slider 233 on potentiometer 230, the receiver can be adapted to operate in two independent modes. In one mode (slider 233 toward bottom of potentiometer 230), the receiver is responsive only to strong signals received at the input of the receiver. In the other mode (slider 233 near top of potentiometer 230), the receiver produces output substantially equal in magnitude regardless of the strength of the signal received at the input of the receiver. In the latter mode, the receiver cannot be overloaded because the audio automatic volume control action prevents overloading of the audio stages of the receiver.

Listed below are the actual values which can be used in the system of FIGURE 3 for satisfactory operation.

| Component: | Description |
|---|---|
| 228 | Type 7R7 tube. |
| 256 | Type 6K6 GT tube. |
| 275 | Hammond transformer Type 141 (Guelph, Ontario). |
| 230 | 1 megohm control potentiometer (Audio Taper, I.R. Co.). |
| 235 | 47,000 ohm, ½ watt resistor. |
| 253 | 0.1 microfarad capacitor. |
| 255 | 1 megohm resistor. |

All other components original equipment of Canadian Marconi Model 218, Serial No. 7555 (not modified).

Figure 4:
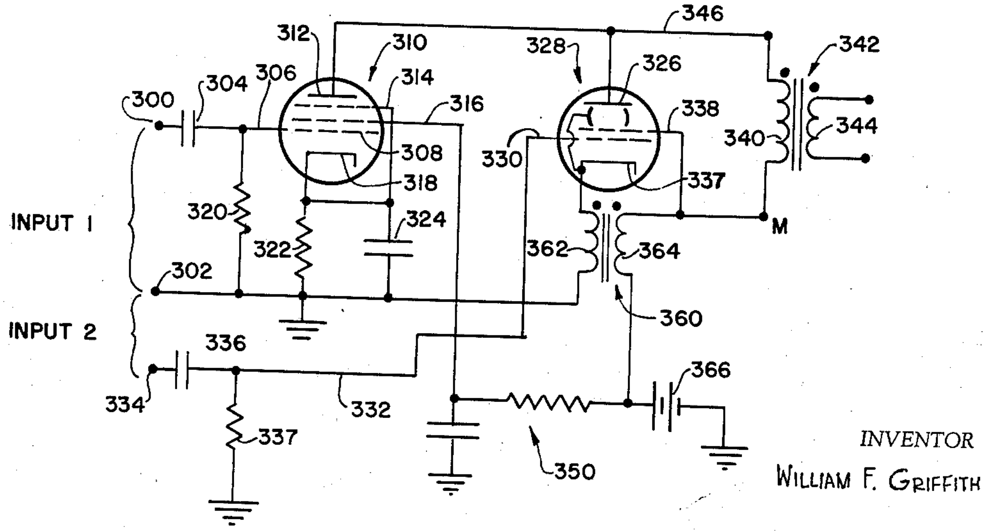
FIGURE 4 is a schematic diagram of the invention as it would be utilized for the purpose of mixing signals.

The system presented in FIGURE 4 of the drawings is essentially the same system as presented in FIGURE 1, however, instead of having the grids of the valves of the first and second stage connected together, a separate lead has been provided to the control grid of the second stage. The system serves as a mixer as will become apparent hereinafter. A first input is fed into the system between points 300 and 302 and such signal passes via capacitor 304 and lead 306 to control grid 308 of a valve 310 in the first stage. The valve 310 has a plate 312, a suppressor grid 314, a screen grid 316, and a cathode 318. The control grid 308 is connected to ground via a grid leak resistor 320, the suppressor grid 314 is connected to the cathode 318, and the screen grid 316 is connected to a power supply filter system 350. The grid 318 is biased, as shown, by resistor 322 and capacitor 324. The plate 312 of the first stage is connected to the plate 326 of the second stage valve which, as shown, is a beam power tube 328. The control grid 330 of the valve 328 is coupled via lead 332 to the second input point 334. Capacitor 336 is coupled in series with lead 332, and a grid leak resistor 337 is coupled between lead 332 and ground on the grid side of the input capacitor 336. The screen grid 338 of valve 328 is coupled to end M of the primary winding 340 of output transformer 342. The other end of the primary winding 340 is coupled via lead 346 to the anodes 326 and 312 of the valves second and first stage respectively. A primary winding 362 of a transformer 360 is coupled between cathode 337 of valve 328 and ground. The secondary winding 364 of transformer 360 is coupled between end M of primary winding 340 of the output transformer and the positive side of a D.C. power source 366.

Although pentodes have been shown as the valves in the first and second stages of the system of FIGURE 4, it should be understood that triodes could be used as shown in FIGURE 1, or a triode and pentode combination would also function in the system. The essential difference between the systems of FIGURES 1 and 4 is that two signals can be applied to the system of FIGURE 4 and conveniently mixed therein to produce a combined or resultant output across the output transformer 342.

Since the operation of the components of the system of FIGURE 4 is similar to the operation of the components of the system of FIGURE 1, a detailed description of operation of the FIGURE 4 system would merely be repetitious. The transformer 360 serves as an impedance means coupling the cathode 337 with the end M of primary winding 330 and also serves to maintain the voltage between that cathode and electrical ground substantially equal in magnitude and phase to the voltage between end M of winding 340 and electrical ground. Obviously the anodes of the valves in the first and second stages are coupled together with substantially no electrical impedance therebetween, and are coupled to the primary winding 340 of the output transformer 342 via lead 346.

From the foregoing description of the exemplary embodiments of the invention, it should be apparent that the objects set forth at the outset of this specification have been achieved. Accordingly, I claim:

1. An electronic amplifying circuit comprising the combination of a first electronic valve having at least a first anode, a first cathode, and a first control grid; a second electronic valve having at least a second anode, a second cathode, and a second control grid; means coupling an input signal source between said first control grid and said first cathode; means coupling said first cathode to a reference point; means for placing an input signal on said second control grid; a load having at least two terminals; means coupling the first and second anodes together and to one terminal of said load, the potentials with respect to said reference point of said first and second anodes and said one terminal of said load being at least substantially equal to one another, whereby said valves supply signal currents through said load in the same direction when the input signals to said first and second grids are of the same polarity with respect to said first and second cathodes respectively; and impedance means electrically coupled to said reference point and electrically coupling said second cathode with the other terminal of said load to maintain the A.C. signal voltage between said second cathode and said reference point correlated in magnitude and at least substantially equal in phase to the A.C. signal voltage between said other terminal of said load and said reference point, said circuit including an impedance between said first and second cathodes.

2. In an electronic amplifying system, the improvement as defined in claim 1 wherein said impedance means comprises a transformer having a primary winding and a secondary winding, the number of turns in said primary winding being substantially equal to the number of turns in said secondary winding.

3. An electronic amplifying system comprising the combination defined in claim 1 and further including means coupling said first control grid with said second control grid.

4. An electronic amplifying circuit comprising the combination of a first electronic valve having at least a first cathode coupled with electrical ground, first anode, and first input signal receiving controlled grid; and a second electronic valve having at least a second anode, a second cathode, and a second input receiving control grid; an output winding; an interstage transformer having a primary winding and a secondary winding, said windings of said interstage transformer having substantially an equal number of turns; means coupling said first and second anodes together and to one end of said output winding; means coupling said second cathode via said primary winding to ground; and means coupling the other end of said output winding via said secondary winding to a direct current power source, whereby said interstage transformer maintains the voltage between said second cathode and electrical ground substantially equal in phase to the voltage between said other end of said output winding and electrical ground.

5. An electronic amplifying system comprising the combination defined in claim 4 and further including a third electronic valve having a third anode, a third cathode and a third control grid; a second output winding coupled through said secondary winding with said first output winding; means coupling said third cathode to ground, means coupling said second control grid to ground, means coupling said third control grid to said second cathode, and means coupling said third anode to the direct current power source via said second output winding, for push-pull operation of said second and third electronic valves.

6. An electronic amplifying system comprising the combination defined in claim 4 and further including separate means for applying an input signal to said first control grid and said second control grid.

7. An electronic amplifying circuit comprising the combination defined in claim 4 wherein said first electronic valve comprises a remote cut-off tube, and wherein said combination further includes audio detecting means, potentiometer means coupled to said detecting means, and means coupling said first control grid directly with said detecting means via said potentiometer means.

8. An electronic amplifying circuit as defined in claim 7 wherein said interstage transformer has a tertiary winding coupled between said second control grid and electrical ground.

9. An electronic amplifying circuit comprising the combination of a first electronic valve having at least a first anode, a first cathode, and a first control grid; a second electronic valve having at least a second anode, a second cathode, and a second control grid; means coupling an input signal source between said first control grid and said first cathode to apply an input signal therebetween; means coupling said first cathode to a reference point; means coupling said second control grid to said first cathode; a load having at least two terminals; means coupling the first and second anodes together and to one terminal of said load, the potentials with respect to said reference point of said first and second anodes and said one terminal of said load being at least substantially equal to one another, whereby said valves supply signal currents through said load in the same direction when the input signals to said first and second grids are of the same polarity with respect to said first and second cathodes respectively; and means, offering substantial impedance to a signal of comparable frequency with said input signal, for electrically coupling said second cathode to said reference point and means electrically coupling said second cathode with the other terminal of said load for maintaining said other terminal at substantially the same potential as said second cathode with respect to the potential of said reference point for frequencies of comparable frequency with said input signal, said circuit including an impedance between said first and second cathodes.

10. An electronic amplifying circuit comprising the combination of a first electronic valve having at least a first anode, a first cathode, and a first control grid; a second electronic valve having at least a second anode, a second cathode, and a second control grid; means coupling an input signal source between said first control grid and said first cathode; means coupling said first cathode to a reference point; means coupling said second control grid to said first control grid; a load having at least two terminals; means coupling the first and second anodes together and to one terminal of said load, the potentials with respect to said reference point of said first and second anodes and said one terminal of said load being at least substantially equal to one another, whereby said valves supply signal currents through said load in the same direction when the input signals to said first and second grids are of the same polarity with respect to said first and second cathodes respectively; and impedance means electrically coupled to said reference point and electrically coupling said second cathode with the other terminal of said load to maintain the A.C. signal voltage between said second cathode and said reference point correlated in magnitude and at least substantially equal in phase to the A.C. signal voltage between said other terminal of said load and said reference point, said circuit including an impedance between said first and second cathodes.

References Cited in the file of this patent

UNITED STATES PATENTS

| | | |
|---|---|---|
| 1,916,818 | White | July 4, 1933 |
| 1,995,362 | Peterson | Mar. 26, 1935 |
| 2,077,049 | MacDonald | Apr. 13, 1937 |
| 2,593,490 | Sanders | Apr. 22, 1952 |
| 2,626,349 | Page | Jan. 20, 1953 |
| 2,807,662 | Mattingly | Sept. 24, 1957 |
| 2,841,706 | Kuenstner et al. | July 1, 1958 |